(12) United States Patent
Ives

(10) Patent No.: US 6,798,113 B2
(45) Date of Patent: Sep. 28, 2004

(54) FLEXURE WITH INTEGRAL ELECTROSTATIC ACTUATOR

(75) Inventor: Thomas Wayne Ives, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 45 days.

(21) Appl. No.: 10/124,888

(22) Filed: Apr. 18, 2002

(65) Prior Publication Data

US 2003/0197445 A1 Oct. 23, 2003

(51) Int. Cl.[7] ................................................. H02N 1/00
(52) U.S. Cl. .................. 310/309; 360/294.4; 369/44.16
(58) Field of Search ........... 310/309; 360/294.1–294.5; 369/44.16, 44.18, 126

(56) References Cited

U.S. PATENT DOCUMENTS

| | | | | |
|---|---|---|---|---|
| 4,374,402 A | * | 2/1983 | Blessom et al. | 360/104 |
| 5,375,033 A | * | 12/1994 | MacDonald | 361/281 |
| 5,563,446 A | | 10/1996 | Chia et al. | 257/704 |
| 6,181,531 B1 | * | 1/2001 | Koshikawa et al. | 360/294.4 |
| 6,307,298 B1 | * | 10/2001 | O'Brien | 310/309 |

FOREIGN PATENT DOCUMENTS

| | | | | |
|---|---|---|---|---|
| JP | 05-076187 | * | 3/1993 | ............ H02N/1/00 |
| JP | 10-109284 | * | 4/1998 | .............. B25J/7/00 |
| JP | WO9819304 | * | 5/1998 | ........... G11B/21/10 |

OTHER PUBLICATIONS

Banks, D., "Microsystems, Microsensors & Microactuators: An Introduction", http://www.dbanks.demon.co.uk/ueng/, Apr. 1999.

How e R.T., Muller R.S., Gabriel K.J., Trimmer W.S.N., "Silicon micromechanics: sensors and actuators on a chip", IEEE Spectrum, Jul. 1990, pp. 29–35, (1990).

Jaecklin V.P., Linder C., de Rooij N.F., Moret J.M., Bischof R., Rudolf F. "Novel polysilicon comb actuators for xy–stages" Micro Electro Mechanical Systems '92, Travemunde, Germany, Feb. 4–7, pp. 147–149 (1992).

Chan, Dutton, Electrostatic Micromechanical Actuator with Extended Range of Travel (Journal of Microelectromechanical Systems, vol. 9, No. 3, pp. 1–30 (Sept. 2000).

* cited by examiner

Primary Examiner—Karl Tamai

(57) ABSTRACT

A flexure for a micro-electro-mechanical device includes a longitudinal beam. An actuator integral to the beam acts to flex the beam when activated.

19 Claims, 7 Drawing Sheets

FLEXURE WITH INTEGRAL ELECTROSTATIC ACTUATOR

REFERENCE TO CO-PENDING APPLICATION

Reference is made to co-pending U.S. patent application Ser. No. 10/125,098, entitled "MEMS DEVICE HAVING A FLEXURE WITH INTEGRAL ACTUATOR", filed on like date herewith and having common inventorship and assignment.

FIELD OF THE INVENTION

The present invention generally relates to micro-electromechanical devices, and more particularly to a micro-electro-mechanical flexure having an integrally formed actuator for bending the flexure.

BACKGROUND OF THE INVENTION

Micro-electro-mechanical systems (hereinafter "MEMS") are integrated systems of small size where the feature sizes are generally of micron dimensions. MEMS devices are created on a common silicon substrate utilizing microfabrication technology like that used for integrated circuit (IC) processing. The fabrication processes selectively etch away parts of the silicon wafer or add new structural layers to form the mechanical and electro-mechanical devices.

One unique feature of MEMS is the extent to which actuation, sensing, control, manipulation, and computation are integrated into the same system. Examples of MEMS devices include individually controlled micro-mirrors used in a projection display, accelerometers that sense a crash condition and activate airbags in cars, pressure sensors, "lab on a chip" systems, and data storage devices.

Many MEMS devices include masses that are moveable within the system. In these MEMS devices, beams or flexures are often used to support the moveable masses in the system. The beams supply both support of the system's mass and compliance for the system's mass movements. If motion of the system's mass must be limited, additional features are generally created in the system to limit the motion as desired. The actual movement of a system's mass is accomplished by yet another device separate from the beams or flexures and motion limiting features. Referred to herein generically as actuators or micro-actuators, various types of devices may be used to cause movement of a system's mass. Micro-actuators which are used in MEMS devices use a variety of methods to achieve actuation: electrostatic, magnetic, piezoelectric, hydraulic and thermal.

In MEMS devices such as those mentioned above, space limitations of the device must be considered. Even though MEMS devices are by definition already extremely small, it may be desired to maximize the size of one component of the device relative to the size of another component or to the size of the entire device. Thus, it would be desirable to reduce the space occupied by such other components of the device, or to eliminate selected components entirely. In addition, it would be desirable to reduce the number of process steps needed to fabricate a particular MEMS device or specific components of a MEMS device. As noted above, MEMS devices are manufactured using micro-fabrication technology like that used in the production of integrated circuits. A reduction or simplification of the process steps required to form a particular MEMS device or one of its components would speed the manufacturing process, and reduce the likelihood of error in the manufacturing process.

SUMMARY OF THE INVENTION

A flexure for a micro-electro-mechanical device includes a longitudinal beam. An actuator integral to the beam acts to flex the beam when activated.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
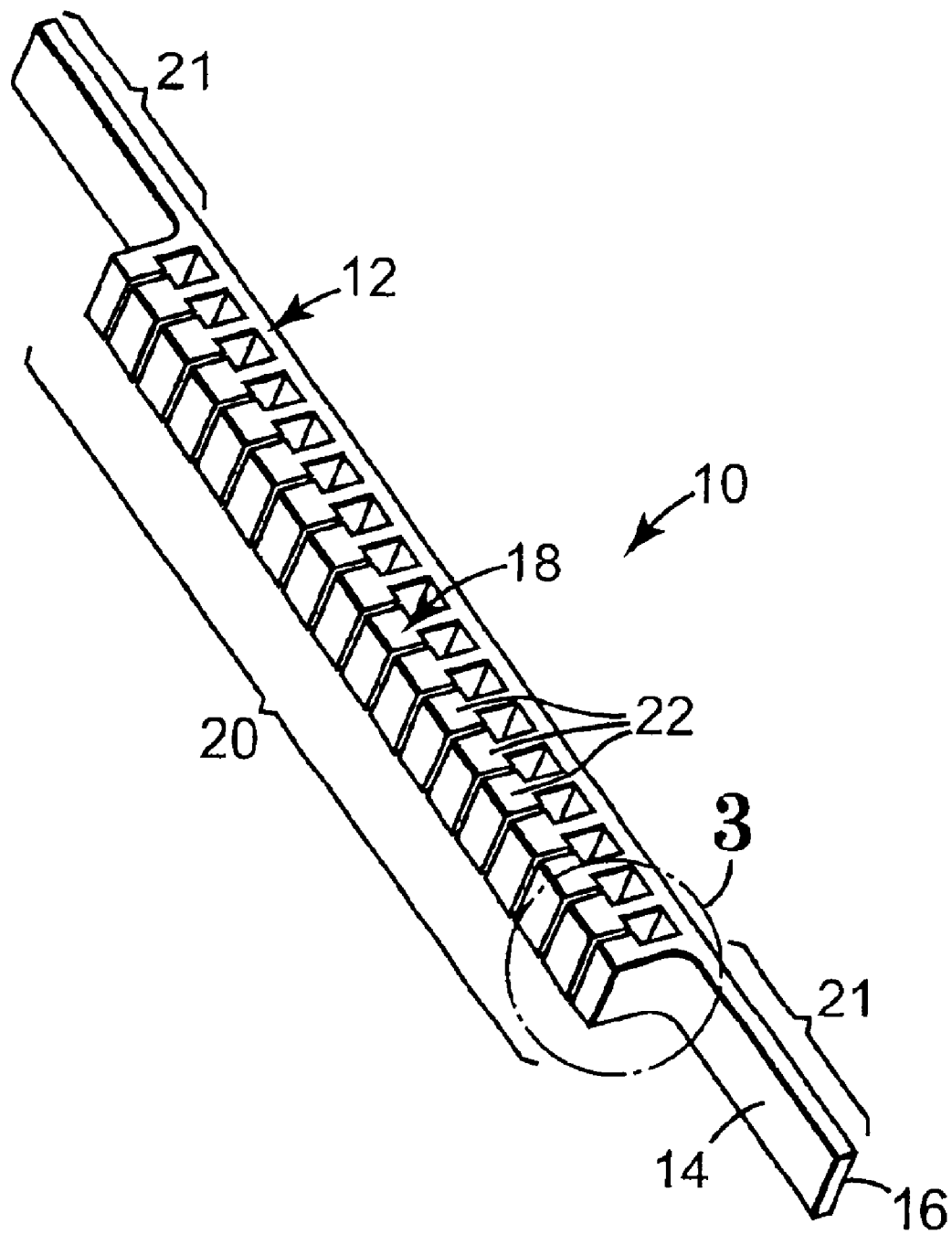
FIG. 1 is a perspective view of one embodiment of the inventive flexure.
Figure 2:
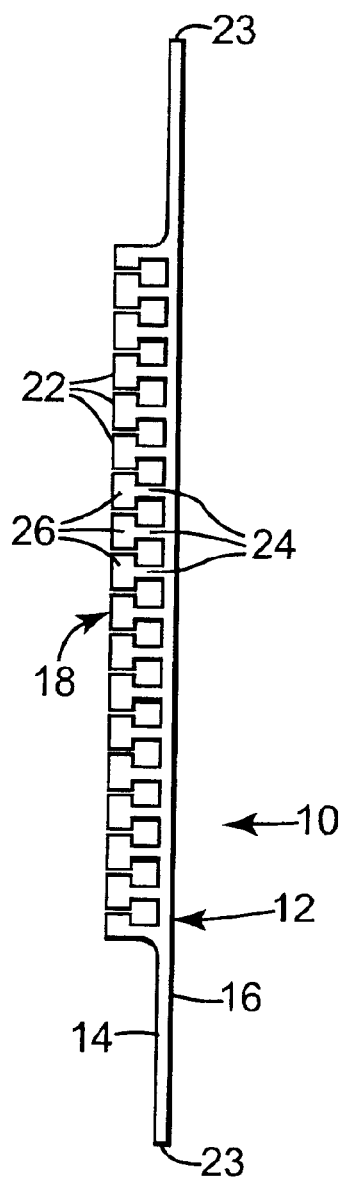
FIG. 2 is a top plan view of the embodiment of the inventive flexure shown in FIG. 1.
Figure 3:
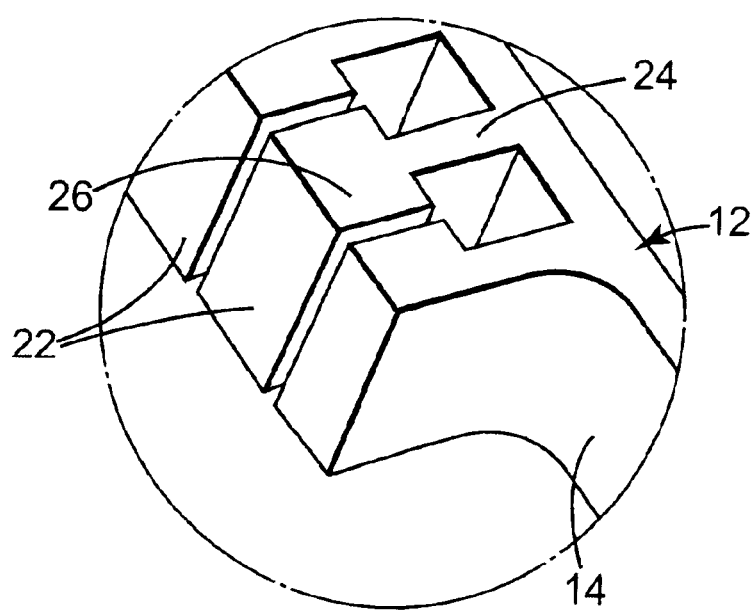
FIG. 3 is a greatly enlarged view of the circled portion 3 of FIG. 1.

One embodiment of a flexure 10 for use in a micro-electro-mechanical system (MEMS) is shown in FIGS. 1–3. The flexure 10 includes a compliant longitudinal beam 12 having a first side 14 and a second side 16 opposite first side 14. An actuator 18 is integrally formed with beam 12. The actuator 18 may be selectively activated to flex beam 12. In use, flexure 10 may, for example, be positioned to interact with a movable mass (not shown), such that flexing of beam 12 by actuator 18 moves the moveable mass.

As shown in FIGS. 1 and 2, actuator 18 is integrally formed as part of a central section 20 of beam 12. However, actuator 18 may be positioned along any portion of the length of beam 12 (such as adjacent an end 23 of beam 12), or along the entire length of beam 12, as is required for a particular application. The end sections 21 of beam 12 may be of any length appropriate for the flexures intended use. The dimensions of the embodiment of invention shown in FIGS. 1–3 should not be construed as limiting with regard to the dimensions and positioning of actuator 18.

In the embodiment of flexure 10 shown in FIGS. 1–3, actuator 18 is of an electrostatic nature. That is, actuator 18 is selectively activated by the presence of an electrostatic charge. In one embodiment of the invention, actuator 18 comprises a plurality of force elements 22 projecting from the first side 14 of beam 12. When flexure 10 is electrostatically charged, force elements 22 move apart from each other due to a repulsive electrostatic force and thereby flex beam 12 towards its second side 16.

Figure 4A:
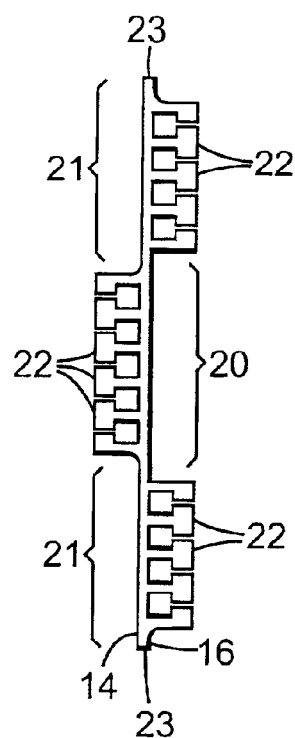
FIGS. 4a and 4b are top plan views of another embodiment of the inventive flexure.
Figure 4B:
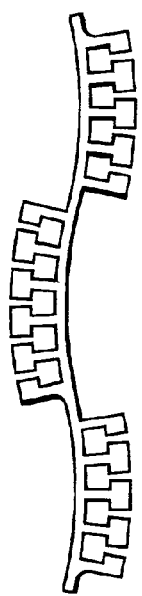

Force elements 22 may also be positioned on both sides of beam 12. As shown in FIG. 4a, force elements 22 are positioned adjacent both first side 14 and second side 16 of beam 12. The group of force elements 22 positioned on first side 14 in the central section 20 of beam 12 will act to flex end sections 21 of beam 12 toward second side 16. At the same time, the group of force elements 22 positioned on second side 16 in the end sections 21 of beam 12 will act to flex the ends 23 of beam 12 back toward first side 14. When electrostatically charged, beam 12 will have a shape similar to that shown in FIG. 4b (the shape of beam 12 in FIG. 4b is greatly exaggerated for illustrative purposes). Force elements 22 may be positioned along the beam 12 in configurations other than that shown which result in the desired shape of beam 12 when electrostatically charged.

Force elements 22 also function to limit the bending or flexing of beam 12 toward the side of the beam 12 with force elements 22. In the embodiments shown in FIGS. 1–3, force elements 22 limit the bending of beam 12 toward its first side 14. In particular, as beam 12 flexes toward its first side 14, force elements 22 contact each other and thereby prevent further flexing or bending of beam 12 in that direction. In this manner, additional elements intended to limit the movement of beam 12 or a mass with which it interacts do not need to be incorporated in the MEMS device using flexure 10.

When used as a micro-electro-mechanical device, beam 12 may have a width between the first side 14 and second side 16 in the range of 100,000 angstroms (10 microns) or less, and more typically less than 30,000 angstroms (3 microns), depending upon the intended application of flexure 10. Beam 12 may also preferably be a high aspect ratio beam. In one possible embodiment, beam 12 will have an aspect ratio of at least 3, but the aspect ratio may be much more or less depending upon the application. A high aspect ratio in beam 12 creates more surface area between adjacent force elements 22, and thus creates a larger actuation force between adjacent force elements 22 when flexure 10 is electrostatically charged. The aspect ratio of beam 12 will be influenced by factors including the force required to be generated by actuator 18 of flexure 10, the strength of the electrostatic charge and the amount of available space in the MEMS device.

In one embodiment of the invention, force elements 22 comprise T-shaped (or hammer-shaped) elements which are monolithically attached to and extend from the first side 14 of beam 12. Each T-shaped element comprises a T-stem 24 and a T-cross member 26, with the T-stem 24 extending from beam 12. T-cross members 26 move apart from each other when electrostatically charged to flex beam 12 toward second side 16. T-cross members 26 will contact each other if beam 12 is flexed toward first side 14, and thereby limit the degree to which beam 12 can flex toward first side 14.

Figure 5A:
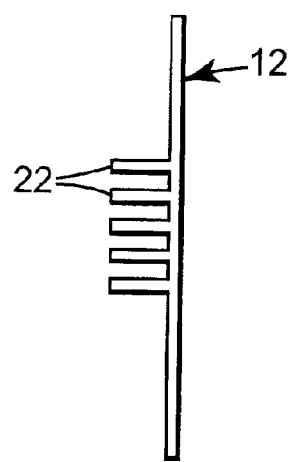
FIGS. 5a and 5b are top plan views of additional embodiments of the inventive flexure.
Figure 5B:
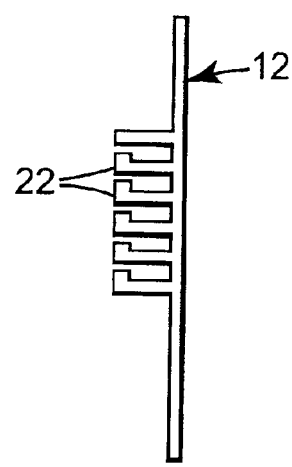

Force elements 22 may have shapes other than a T-shape as illustrated in FIGS. 1–3. For example, force elements 22 may be straight (FIG. 5a), L-shaped (FIG. 5b), or any other shape which may used to create a repulsive force when electrostatically charged.

Figure 6A:
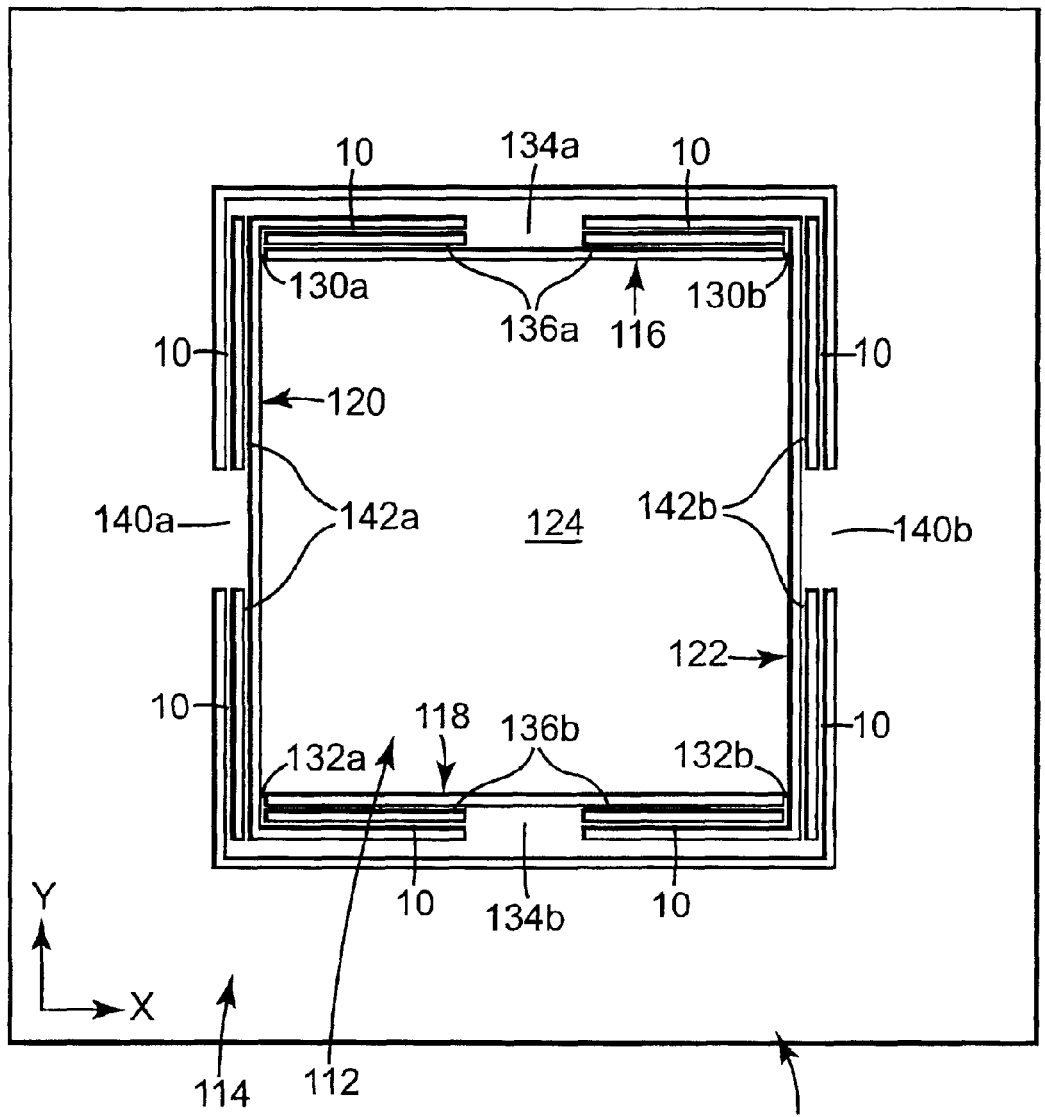
FIGS. 6a and 6b are a plan view and a perspective view, respectively, of the inventive flexure used in a data storage module.
Figure 6B:
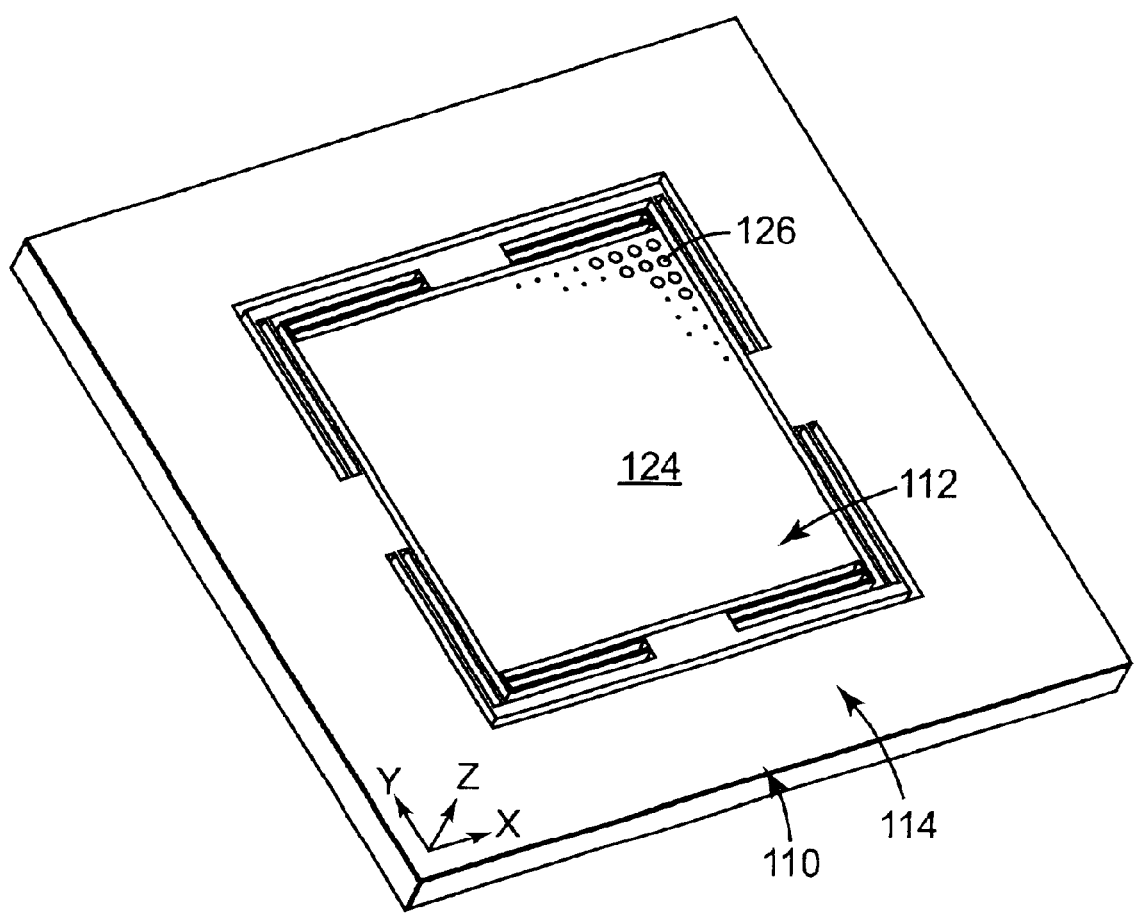

One possible application for the flexure 10 having an integrally formed actuator 18 as described above is illustrated in FIGS. 6a and 6b. FIGS. 6a and 6b show one embodiment of a high-density storage module 110. Storage module 110 includes a rotor 112 and a frame 114 for supporting rotor 112. Rotor 112 is bounded by its top edge 116, bottom edge 118, left edge 120 and right edge 122. The front face 124 of rotor 112 defines an X-Y plane, with top edge 116 and bottom edge 118 aligned with the X-axis, and left edge 120 and right edge 122 aligned with the Y-axis.

Front face 124 of rotor 112 is formed from a storage medium that has a plurality of storage areas 126 for data storage. The storage areas 126 (shown generically in FIG. 6b) are in one of a plurality of states to represent data stored in that area. Rotor frame 114 is spaced from rotor edges 116, 118, 120 and 122. In one embodiment, rotor frame 114 surrounds rotor 112 in the X-Y plane. (As used herein, directional terms such as top, bottom, left, right, front and back are relative terms, and should not be construed as a limitation on the overall orientation of the storage module 110).

Rotor 112 is supported within rotor frame 114 by a plurality of flexures 10 which interconnect rotor 112 and rotor frame 114. Force elements 22 of flexures 10 are not illustrated in FIGS. 6a and 6b for reasons of clarity. However, flexures 10 are of the type described above having integrally formed actuators 18. The flexures 10 supply both support of the rotor 112 and compliance for movements of rotor 112. In controlling the motion of rotor 112, it is often desirable to have the greatest in-plane to out-of-plane compliance ratio (referred to herein as the compliance ratio) possible. However, this ratio can be limited by the chosen mechanical architecture. The reason a high compliance ratio is desirable is that the forces provided by the actuator 18 integrally formed in flexures 10 are not very strong. Improving in-plane compliance while maintaining, or improving, the compliance ratio allows the relatively weak forces of integral actuators 18 to move rotor 112 in an acceptable manner. Increasing the in-plane compliance may be accomplished by allowing for axial shortening of the flexures 10. That is, as the flexures 10 bend they tend to become shorter in their axial direction which leads to a decrease in the in-plane compliance. Compensating for this axial shortening will increase the in-plane compliance. An additional way to improve the in-plane compliance while keeping the out-of-plane compliance low and still improving the compliance ratio is to allow the ends of the flexures 10 to move angularly. Even a small angle at either or both ends of the beam 12 can significantly increase the in-plane compliance. In many instances, the same structure may compensate for axial shortening and also allow angular movement of the beam.

Figure 7A:
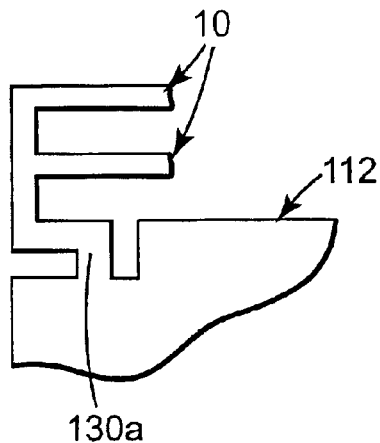
FIGS. 7a and 7b are alternate embodiments of one portion of the data storage module of FIGS. 6a and 6b using the inventive flexure.
Figure 7B:
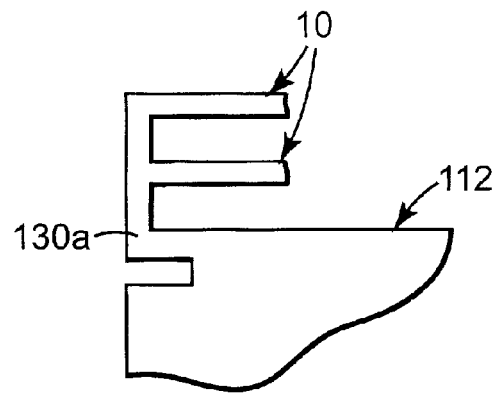

As shown in FIGS. 6a and 6b, to compensate for axial shortening and also allow angular movement of the flexures 10, a first pair of coupling beams 130a, 130b extend from top edge 116 of the rotor 112, while a second pair of coupling beams 132a, 132b extend from bottom edge 118 of rotor 112. In the embodiment shown in FIGS. 6a and 6b, rotor 112 is rectangular in shape and first set of coupling beams 130a, 130b, 132a, 132b extend from the corners of rotor 112. Coupling beams 130a, 130b, 132a, 132b are generally aligned with the left and right edges 120, 122 of rotor 112. However, coupling beams 130a, 130b, 132a, 132b may have a different origination and orientation from that shown in FIGS. 6a and 6b. For example, the alternate embodiments shown in FIGS. 7a and 7b allow coupling beam 130a additional freedom to rotate and thereby provide additional in-plane compliance to the rotor 112.

First pair of coupling beams 30a, 30b are connected to first coupling mass 134a (positioned adjacent top edge 116 of rotor 112) by flexures 136a extending between the first pair of coupling beams 130a, 130b and first coupling mass 134a. Second pair of coupling beams 132a, 132b are connected to second coupling mass 134b (positioned adjacent bottom edge 118 of rotor 112) by flexures 136b extending between the second pair of coupling beams 132a, 132b and second coupling mass 134b. First set of flexures 136a, 136b, have an axial orientation which is generally aligned with the top and bottom edges 116, 118 of rotor 112.

Rotor frame 114 includes first and second flexure mounts 140a, 140b, which are positioned on opposite sides of rotor 112 (adjacent left edge 120 and right edge 122 as shown in FIG. 6a). First and second coupling masses 134a, 134b are connected to first flexure mount 140a by flexures 142a. First and second coupling masses 134a, 134b are connected to second flexure mount 140b by flexures 142b. Second set of flexures 142a, 142b have an axial orientation which is generally aligned with the left and right edges 120, 122 of rotor 112. Coupling masses 134a, 134b simply act as rigid bodies to translate movement between flexures 142a, 142b and flexures 136a, 136b.

It should be noted that in the embodiment shown in FIGS. 6a and 6b, the sets of flexures 136a, 136b, 142a, 142b each comprise a total of four individual flexures. However, a different number of individual flexures may be used in the sets of flexures (for example, a total of two or six flexures in each set).

The faces of flexures 136a, 136b are in the X-Z plane; this set of flexures may be flexed in the Y direction allowing the rotor 112 to move in the Y direction with respect to the frame 114. The faces of flexures 142a, 142b are in the Y-Z direction; this set of flexures may be flexed in the X direction allowing the rotor 112 to move in the X direction with respect to the frame 114.

Figure 8:
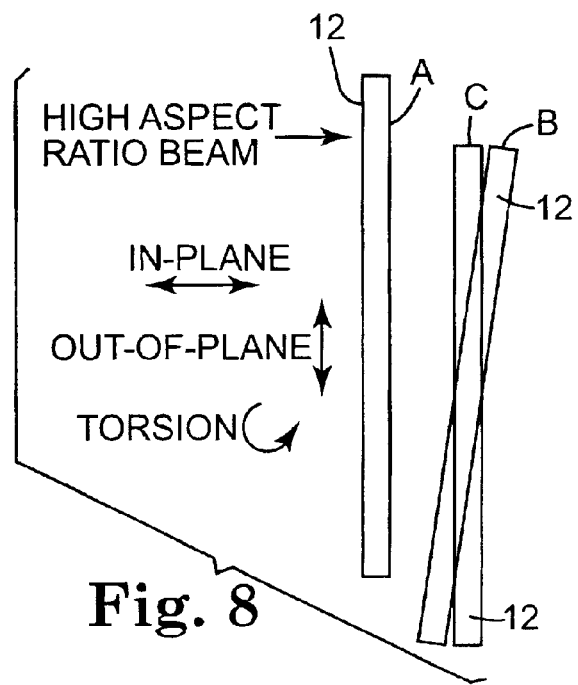
FIG. 8 is an illustration of beam movement and torsion in the data storage module of FIGS. 6a and 6b.

A simplified axial view of one of the high aspect beam flexures 10 is shown in FIG. 8. As the beams 12 are flexed in-plane and out-of-plane, a torsion occurs in the beams 12. This torsion occurs even though the beam 12 does not twist with respect to its axial plane. FIG. 8 shows end views of a high aspect ratio beam under no load (Position A), in-plane and out-of-plane loads (Position B), and in-plane, out-of-plane and torsion loads (Position C). Because the motion of the rotor 112 puts the beam 12 in torsion due to the moment arms arising from displacement, the beam's tendency is to flex back from the Position C illustrated in FIG. 8 toward the Position B illustrated in FIG. 8. As noted above, it is often desirable to have the greatest in-plane to out-of-plane compliance ratio possible. However, this compliance ratio is often decreased by the beam torsions described above. In order to maintain a higher compliance ratio, it is desirable to decrease the beam's torsional and out-of-plane compliance while maximizing its in-plane compliance.

In the high density storage module described herein, the beams torsional and out-of-plane compliance is reduced by aligning the flexures 10 in such a way as to effectively counteract the torsions created in the flexures 10 as the rotor 112 is displaced along the Z-axis, such as by vibrational forces. The greatest counteraction effect is achieved when flexures 136a, 136b are oriented to axially point at the midpoint of flexures 142a, 142b. However, counteraction of the torsions are also achieved the lesser extent when the intersection is not at the midpoint of flexures 142a, 142b. Thus, the position of the first and second set of flexures 136a, 136b, is such that the axis of the first and second set of flexures 136a, 136b, intersects the flexures 142a, 142b somewhere along the length of flexures 142a, 142b.

Figure 9:
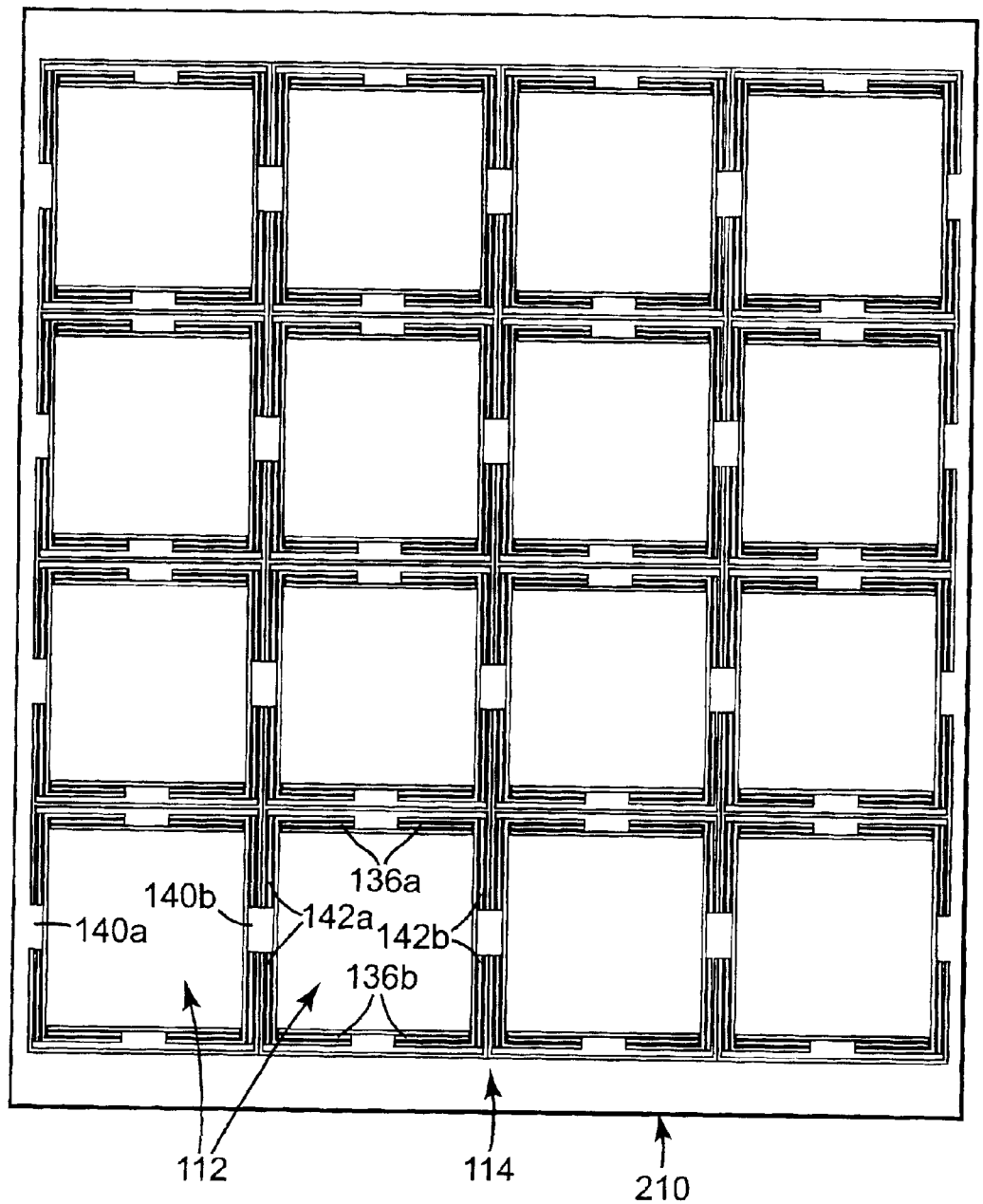
FIG. 9 is a plan view of another embodiment of a data storage module using the inventive flexure.

Although the storage module 110 has been described above with respect to a single rotor 112 supported by frame 114, in practice a plurality of rotors 112 may be supported by frame 114. A storage module 210 having an array of rotors 112 is illustrated in FIG. 9. It will be noted that the orientation of flexures 136a, 136b, 142a, 142b provides a significant benefit when a plurality of rotors 112 are used in the storage module 210. Specifically, flexures 136a, 136b, 142a, 142b are arranged about the periphery of rotors 112 such that flexures 136a, 136b, 142a, 142b are each in substantially parallel alignment with the respective adjacent edges of rotors 112. Thus, the total area required for each rotor 112 and its associated suspension system is reduced and the packing density of rotors 112 within storage module 210 is correspondingly increased.

The packing density of the rotors 112 in storage module 210 may be further increased, as illustrated in FIG. 9, by eliminating the majority of the frame 114 between adjacent rotors 12. Specifically, it can be seen in FIG. 9 that the frame 114 is reduced to leave only the flexure mounts 140a, 140b of adjacent rotors 112. That is, the only portion of frame 114 between adjacent rotors is the flexure mounts 140a, 140b. The flexure mounts are mechanically secured to a motion ground, so that each rotor of the array of rotors 112 may move independently. Of course, frame 114 may also be extended so that it fully surrounds each rotor, if that is desired.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electro-mechanical, and electrical arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A flexure for a micro-electro-mechanical device, the flexure comprising:
   a continuous longitudinal beam; and
   an electrostatic actuator integral to the beam, the electrostatic actuator comprising a plurality of electrostatically chargeable force elements positioned on a first longitudinal side of the beam and movable apart from each other at the urging of a repulsive electrostatic force, thereby acting to flex the beam in a direction normal to a longitudinal axis of the beam toward a second longitudinal side of the beam when activated.

2. The flexure of claim 1, wherein the electrostatic actuator is part of a central segment of the beam.

3. The flexure of claim 1, wherein the force elements limit flexing of the beam toward its first longitudinal side.

4. The flexure of claim 3, wherein each of the plurality of force elements comprises a T-shaped element extending from the first longitudinal side of the beam.

5. The flexure of claim 4, wherein each T-shaped element comprises a T-stem and a T-cross member, and wherein the T-stem extends from the beam.

6. The flexure of claim 1, wherein the beam has a width between the first and second longitudinal sides of less than 30,000 angstroms.

7. The flexure of claim 6, wherein the beam has an aspect ratio of at least 3.

8. A micro-electro-mechanical device comprising:
   a compliant member for interacting with a moveable mass; and
   an electrostatic actuator monolithically formed with the compliant member for flexing the compliant member and moving the mass, wherein the electrostatic actuator comprises a plurality of electrostatically chargeable elements projecting from a single side of the compliant member, the projecting elements acting to move apart from each other when electrostatically charged and flex the compliant member in a direction normal to a longitudinal axis of the compliant member.

9. The device of claim 8, wherein the electrostatically chargeable elements are hammer-shaped.

10. The device of claim 8, wherein the electrostatically chargeable elements are L-shaped.

11. The device of claim 8, wherein the compliant member is a beam having a width less than 100,000 angstroms.

12. The device of claim 8, wherein the compliant member is a beam having an aspect ratio of 3 or greater.

13. A flexible support for a micro-electro-mechanical device, the flexible support comprising:
   a longitudinal beam; and
   an actuator integral to the beam, the actuator comprising a plurality of electrostatically chargeable force elements spaced along the longitudinal axis of the beam and acting to flex the beam in a direction normal to the longitudinal axis when activated, wherein the force elements are activated and move apart from each other when an electrostatic charge is applied to the flexible support, and wherein the force elements all project from a first side of the beam.

14. The flexible support of claim 13, wherein the force elements move apart from each other to flex ends of the beam away from the first side.

15. The flexible support of claim 4, wherein the force elements are shaped to limit flexing of the beam toward the first side.

16. A flexible support for a micro-electro-mechanical device, the flexible support comprising:
   a longitudinal beam; and
   an actuator integral to the beam, the actuator comprising a plurality of electrostatically chargeable force elements spaced along the longitudinal axis of the beam and acting to flex the beam in a direction normal to the longitudinal axis when activated, wherein the force elements are activated and move apart from each other when an electrostatic charge is applied to the flexible support, wherein a first group of force elements on a first longitudinal beam section project from a first side of the beam, and a second group of force elements on a second longitudinal beam section project from a second side of the beam, and wherein the first group of force elements move apart from each other to flex ends of the first longitudinal beam section away from the first side, and the second group of force elements move apart from each other to flex ends of the second longitudinal beam section away from the second side.

17. A flexible support for a micro-electro-mechanical device, the flexure comprising:
   a beam having a longitudinal axis; and
   a first plurality of electrostatically chargeable force elements positioned on a first side of the longitudinal axis, the force elements moveable apart from each other and acting to flex the beam in a direction away from the first side when activated by an electrostatic charge applied to the flexible support.

18. The flexible support of claim 17, further comprising:
   a second plurality of electrostatically chargeable force elements positioned on a second side of the longitudinal axis, the force elements moveable apart from each other and acting to flex the beam in a direction away from the second side when activated by an electrostatic charge applied to the flexible support.

19. The flexible support of claim 18, wherein the first plurality of electrostatically chargeable force elements are on a first longitudinal beam section and the second plurality of electrostatically chargeable force elements are on a second longitudinal beam section.

* * * * *